US007886868B2

(12) United States Patent
Stathopoulos et al.

(10) Patent No.: US 7,886,868 B2
(45) Date of Patent: Feb. 15, 2011

(54) SELF-DRAINING GRILL AND SYSTEM INCORPORATING THE SAME

(75) Inventors: Emmanuel Stathopoulos, Montreal (CA); Simon Jean Vezina, Montreal (CA); Parimal Patel, Montreal (CA)

(73) Assignee: SimplexGrinnell LP, Westminster, MA (US)

( * ) Notice: Subject to any disclaimer, the term of this patent is extended or adjusted under 35 U.S.C. 154(b) by 244 days.

(21) Appl. No.: 12/054,573

(22) Filed: Mar. 25, 2008

(65) Prior Publication Data

US 2009/0242319 A1 Oct. 1, 2009

(51) Int. Cl.
*H05K 5/00* (2006.01)

(52) U.S. Cl. ....................... 181/149; 181/148; 181/198; 181/199; 381/391; D14/209; D14/210; D14/214; D14/204

(58) Field of Classification Search ................. 181/148, 181/149, 198, 199; D14/204, 209, 210, 214; 381/391
See application file for complete search history.

(56) References Cited

U.S. PATENT DOCUMENTS 1,370,382 A * 3/1921 Theis ......................... 181/180
2,718,931 A * 9/1955 Boudouris .................. 181/149
3,679,023 A * 7/1972 Rankin ........................ 181/155
4,071,111 A * 1/1978 Croup ......................... 181/149
4,280,120 A 7/1981 Trafford et al.
4,424,881 A * 1/1984 Hattori ........................ 181/155
5,342,175 A * 8/1994 Patton .................... 416/247 R
D376,149 S * 12/1996 Moose ....................... D14/214
2004/0140892 A1 7/2004 Hanood
2005/0280547 A1 12/2005 Ropke
2006/0177089 A1* 8/2006 Greco et al. ................ 381/391

FOREIGN PATENT DOCUMENTS

JP 2001169378 * 6/2001

OTHER PUBLICATIONS

GORE.COM, "Gore Membrane Vents" available at http://www.gore.com/MungoBlobs/167/313/membrane_vents_GAW_101.pdf; retrieved on Jun. 23, 2009.

* cited by examiner

*Primary Examiner*—Elvin G Enad
*Assistant Examiner*—Forrest M Phillips
(74) *Attorney, Agent, or Firm*—Grossman, Tucker, Perreault & Pfleger PLLC

(57) ABSTRACT

A self-draining grill and system incorporating the same. The grill includes a plurality of ribs extending from a surface of a housing and angled downward in a direction across the surface of the housing. One or more openings are disposed between the ribs and allow air flow to a sound generation device.

25 Claims, 3 Drawing Sheets

SELF-DRAINING GRILL AND SYSTEM INCORPORATING THE SAME

TECHNICAL FIELD

The present disclosure relates to grills for protective enclosures, and more particularly, to a self-draining grill and a system incorporating the same.

BACKGROUND

Typical building safety alarm systems may include a plurality of detectors distributed throughout a building. Upon detecting an alarm condition, signals from one or more of these detectors may be sent to notification appliances which may emit audible alarms and/or flashing lights to alert occupants of the detected condition. The audible alarm may be in the form of a page, alert tones, recorded message, etc, and may be generated by a sound generation device, e.g. a piezoelectric sound device, an electromagnetic sound device, etc. In some applications, it may be important that the sound be at a pressure level that it may be heard over ambient noise. For example, NFPA 72 “National Fire Alarm Code” has required that speakers used in fire systems produce a sound that is at least 15 dB above the noise of a given area.

Notification appliances that are located on the exterior of buildings or in hazardous environments may encounter more demanding conditions of operation. Generally, such a notification appliance may include a housing which may house an audible sound generation device, such as a horn or speaker system, and a strobe light. The housing may generally protect the sound generation device and related electronics from the environment (rain, snow, dust, etc.). The housing may further include a plurality of openings in the form of a grill located adjacent the sound generation device for allowing the sound of the audible alarm to exit the appliance.

In some configurations, the shape and design of the grill may allow rain and snow to enter the interior of the enclosure and cause less than optimum performance (freezing, reduced audible output, failure of electronics, etc.). A rain test specification for such weather proof appliances, CAN/ULC-S525-07, section 7.18.6.A, has been developed to test whether rain will unduly degrade functional performance. In general, the test specification of CAN/ULC-S525-07 involves the spraying of water on such notification appliances at a 45° angle for a period of time, and requires that the sound pressure level shall not be reduced by more than 3 dB after the water spray application compared to the value before the water spray application when measured at the same distance.

BRIEF DESCRIPTION OF THE DRAWINGS

Various features and advantages will be better understood by reading the following detailed description, taken together with the drawings wherein.

DETAILED DESCRIPTION

For simplicity of explanation, various exemplary embodiments disclosed herein may be described in the context of notification appliance including a sound generation device providing an audible alarm regarding a fire or other emergency situation. It is to be understood, however, that the embodiments described herein are presented by way of illustration, not of limitation. For example, embodiments consistent with the present disclosure may be useful in connection with appliances including sound generation devices not used for notification purposes Protective housings for such devices as notification appliances may include a grill which may allow for free air flow and a path for sound from sound generation device to exit the appliance. In outdoor applications, the housing may be exposed to rain, snow, dust and/or other contaminants, and may be required to protect any sensitive components from damage. It has been found that the grill for such housings may be configured to retard the penetration of water into such appliances without unduly impacting the audible output associated with the appliance.

Figure 1:
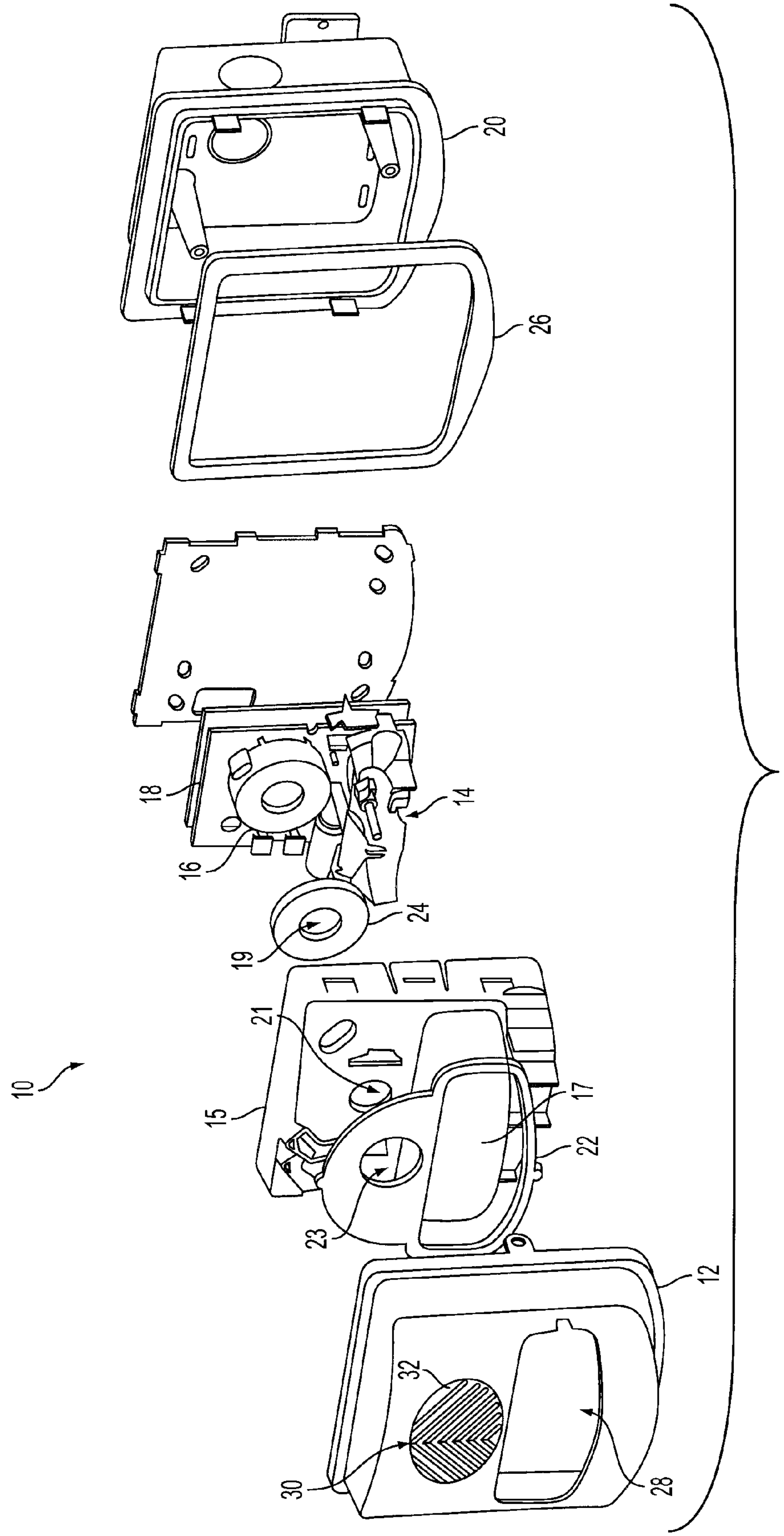
FIG. 1 is an exploded view of one exemplary notification appliance consistent with the present disclosure.

FIG. 1, for example, is an exploded view of one exemplary notification appliance 10, consistent with the present disclosure. The illustrated exemplary embodiment includes: a housing formed by a front cover 12 and a rear casing 20; a strobe light assembly 14; a sound generation device 16; an overlay 15, and a printed circuit board (PCB) 18. The sound generation device may be a sound generation device capable of producing an audible output, e.g., a piezoelectric sound device, an electromagnetic sound device such as a speaker or horn, etc. Upon the occurrence of an alarm condition, the appliance 10 may be operated in a known manner to cause the sound generation device 16 to generate an audible alarm and/or to cause the strobe light assembly 14 to produce a visible flashing alarm for alerting occupants of the alarm condition.

The cover 12 may be formed, e.g. by injection molding, from plastic materials such as polycarbonate (PC) and acrylonitrile-butadiene-styrene (ABS) and blends or alloys thereof. The cover 12 and casing 20 portions of the housing may be joined, e.g. by appropriate fasteners, so that the strobe light assembly 14, sound generation device 16 and PCB 18 are at least partially enclosed therein for protection from environmental elements such as rain, snow, dust, etc. The cover 12 may include an opening 28 through which a portion 17 of the overlay 15 and strobe light assembly 14 may protrude. Gaskets 22, 24 and 26 may be used to weatherproof the appliance 10 and/or dampen vibration generated by the sound generation device 16. The casing 20 may be mountable on wall, e.g. on the inside or outside of a building.

The cover 12 may also include grill 30, which may include one or more ribs 32 and one or more openings 36 (FIG. 3) between the ribs 32. Air may flow from the sound generation device 16 through aligned openings 19, 21, 23, in the gasket 24, overlay 15 and gasket 22, respectively, and through the openings 36 in the grill, allowing sound from the sound generation device 16 to be emitted from the housing. The grill 30 in the illustrated exemplary embodiment is configured to retard or prevent entry of rain, snow, dust and other contaminants to the interior of the housing where such contaminants could damage sensitive components, while allowing sufficient audible output from the sound generation device for providing an alert of an an alarm condition.

Figure 2:
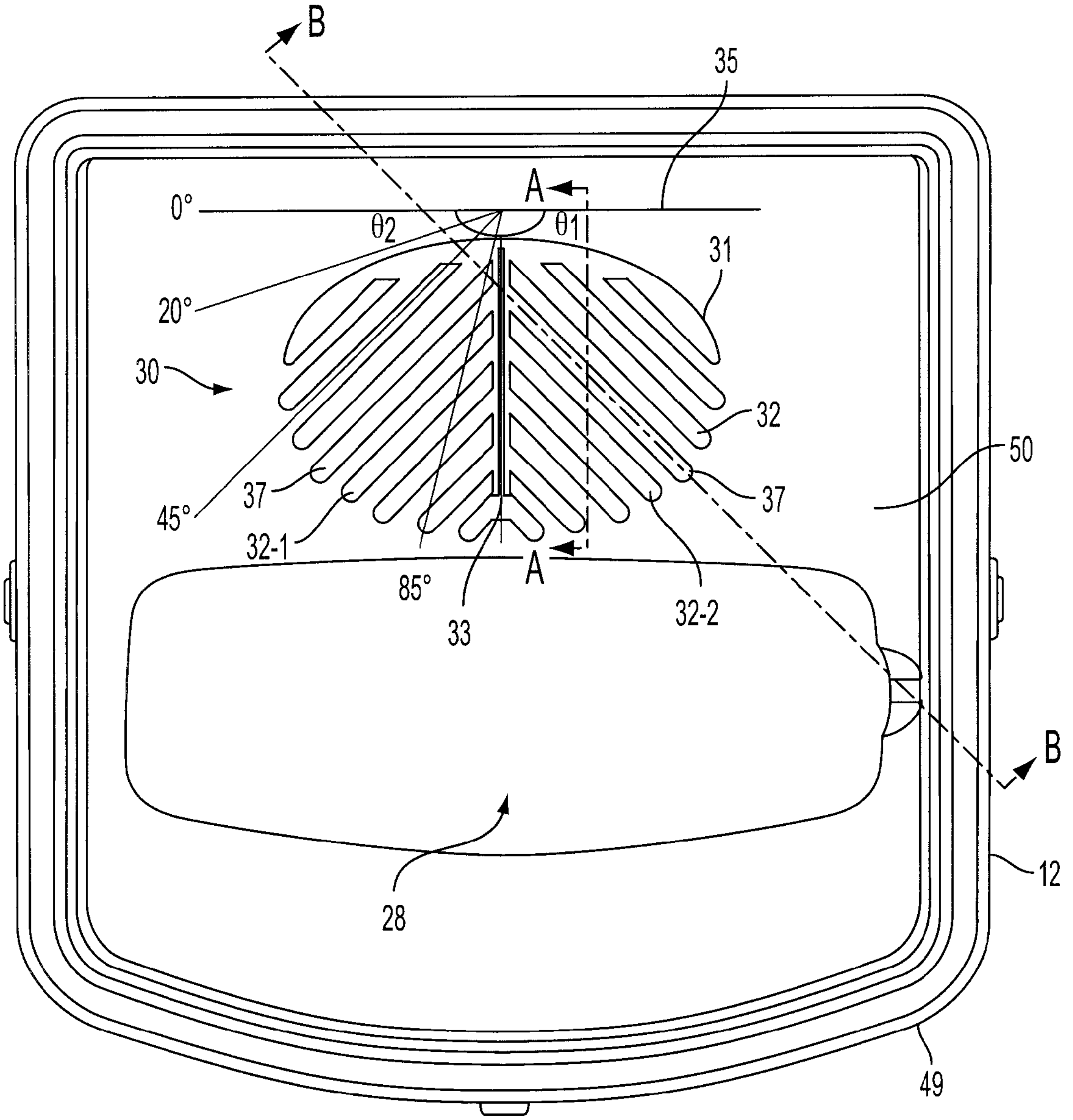
FIG. 2 is a front view of the cover of the notification appliance illustrated in FIG. 1.
Figure 3:
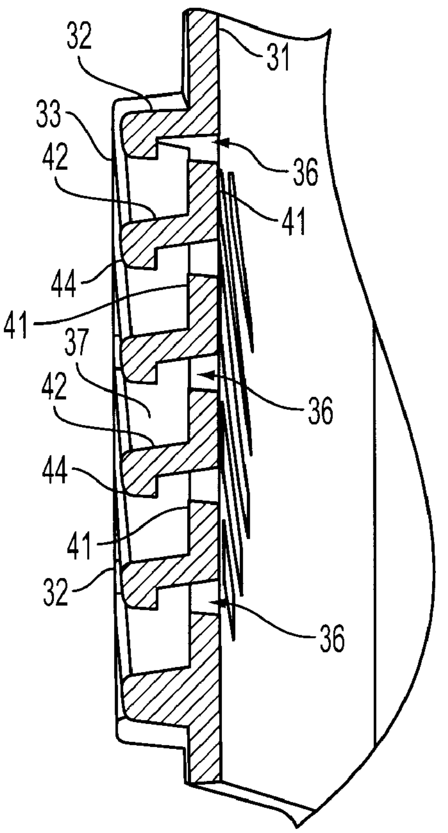
FIG. 3 is a cross-sectional view of the grill portion of the cover illustrated in FIG. 2 taken along line A-A.

FIG. 2 is a front view of the cover 12 illustrating the grill 30. In the illustrated exemplary embodiment, the grill includes a curved grill top portion 31, a central rib 33, the ribs 32 and openings 36 (FIG. 3). As shown, the central rib 33 intersects the curved grill top portion 31 adjacent the center thereof. A first plurality of the ribs 32 extend linearly downwardly in a direction across a front surface 50 of the cover from a first side of the central rib 33 and the curved grill top portion 31 at an angle $\theta_1$ from the horizontal (0°) indicated by line 35 which is generally perpendicular to the central rib 33. A second plurality of the ribs 32 extend linearly downwardly in a direction across a front surface 50 of the cover from a second side of the central rib 33 and curved grill top portion 31 at an angle $\theta_2$ from the horizontal (0°) indicated by line 35. The ribs 32 on opposite sides of the central rib 31 are thus angled away from each other and intersect the central rib such that opposed pairs of ribs, e.g. ribs 32-1 and 32-2, generally present a "reverse" V-shape when viewed from the front.

Figure 4:
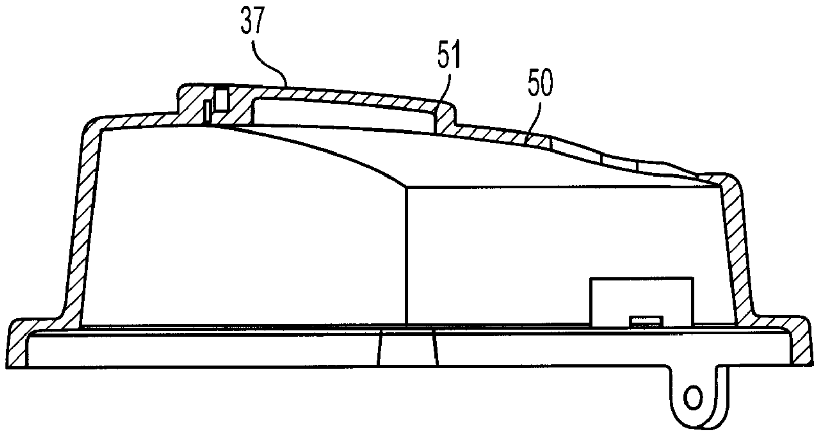
FIG. 4 is a cross-sectional view of the grill portion of the cover illustrated in FIG. 2 taken along line B-B.

As illustrated for example in FIG. 4, the distal end 51 of each rib 32, i.e. the end closest to the bottom 49 of the cover, overlaps the front surface 50 of the housing. Water traveling down the ribs and/or from rib to rib thus has no direct path through the openings 36 into the housing. The angles $\theta_1$ and $\theta_2$ of each of the ribs 32 may thus be chosen such that the force of gravity on water droplets disposed on the uppers surfaces 37 of the ribs 32 overcomes the capillary effect on the water droplets, thereby causing the water droplets to travel down along the upper surfaces 37 of the ribs 32 and/or from one rib to an adjacent rib and away from the openings 36, e.g. onto the exterior surface 50 of the cover.

In the illustrated exemplary embodiment, the same number of ribs is disposed at angles $\theta_1$ and $\theta_2$ of 45° on either side of the central rib 33 and curved grill top portion 31. It has been found, however, that the force of gravity on water droplets disposed on the upper surfaces 37 of the ribs 32 overcomes the capillary effect on the water droplets for angles $\theta_1$ and $\theta_2$ between 20° and 85°. A grill 30 including ribs positioned as shown in the illustrated exemplary embodiment may therefore include ribs positioned at angles $\theta_1$ and $\theta_2$ between 20° and 85°.

It is to be understood, however, that a grill consistent with the present disclosure may include ribs positioned at any angle $\theta_1$ and/or $\theta_2$ sufficient to cause the force of gravity on water droplets disposed on the upper surfaces 37 of the ribs to overcome the capillary effect on the water droplets, thereby causing the water droplets to travel down along the upper surfaces of the ribs and/or from one rib to an adjacent rib and flow away from the openings 36, e.g. onto the exterior surface 50 of the cover. Also, a grill consistent with the present disclosure may include different rib configurations and orientations. For example, the grill may include different numbers of ribs on either side of a central rib and curved grill top portion and/or ribs disposed at different angles on one side and/or both sides of the central rib and curved grill top portion. Also, the central rib may be omitted or placed behind the ribs 32 and/or only a portion of the illustrated grill may be provided, e.g. only a left or right side. The ribs may also be provided in larger or smaller sizes, shapes and/or lengths and may have non-uniform size, shape and/or length.

FIG. 3 is a cross-sectional view taken through the grill 30 along line A-A in FIG. 2, i.e. parallel to the central rib 33. As shown, the grill may include one or more openings 36 between the ribs 32 for allowing air flow to the sound generation device. In the illustrated exemplary embodiment, the ribs 32 include a top flange portion 41 extending along at least a portion of the top surface 37 thereof, a downward sloping body portion 42 angled downward from the flange portion 41 in a direction away from the front surface of the housing, and a downwardly extending arm portion 44 angled downwardly from the body 42. The top flange portion 41 may be co-planar with the front surface 50 of the grill. In one embodiment, the top flange 41 may be configured as a continuation of the front surface of the grill 50, i.e. the front surface may extend between the ribs. In the illustrated embodiment, the openings 36 extend from a top of the flange portion 41 of a first rib to the bottom of the next adjacent rib immediately above the first rib.

The ribs 32 may thus have generally Z-shaped cross-section which allows air, and sound to pass through the openings and travel in a generally serpentine fashion through the grill 30. This may allow essentially no direct path for water, etc. to travel into the interior of the assembly 10. The width of the openings 36 between the ribs 32 may, however, may be adjusted to meet the requirements of the application. In one embodiment, the top flange portion 41 may be omitted and the openings 36 may extend completely from one rib to the next.

In combination with the downward angle of the ribs relative to the front surface of the housing (i.e. at angles $\theta_1$ and $\theta_2$), the angle from the horizontal of the body portion 42 to the flange portion 41 encourages the drainage of water from the surfaces of the ribs as the force of gravity may cause the water to be transferred from one rib to the next rib and/or along the top surfaces of the ribs and onto the front surface 50 of the cover. In one embodiment, the body portion 42 of the ribs may be angled downwardly from the flange portion 41 by an angle of about 5°. It is contemplated that the body 42 and arm 44 portions of the ribs 32 may be formed at angles other than those shown and described. Also, the arm portions 44 and/or the downward slope of the body portion 42 may be omitted.

There is thus provided a self-draining grill and system including the same that retards or prevents entry of rain, snow, dust and other contaminants to the interior of an appliance housing, such as a notification appliance housing, where such contaminants could damage sensitive components, while allowing sufficient audible output from a sound generation device within the housing. In an embodiment as shown in FIG. 1, in a system 10 consistent with the present disclosure the sound pressure level is not reduced more than 3 dB after application of a water spray compared to the value before the water spray application, thereby meeting the requirements of CAN/ULC-S525-07.

According to one aspect of the disclosure, there is provided a system including a sound generation device for generating an audible output; and a housing at least partially enclosing the sound generation device and including a grill. The grill includes a plurality of ribs, the ribs angled downward in a direction across a surface of the housing, each of the ribs having a distal end portion that overlaps the surface of said housing; and one or more openings disposed between the ribs, the openings extending into the housing for allowing air flow to the sound generation device.

According to another aspect of the disclosure, there is provided a grill for a housing that a least partially encloses a sound generation device. The grill includes a plurality of ribs, the ribs angled downward in a direction across a surface of the housing, each of the ribs having a distal end portion that overlaps the surface of said housing, and one or more openings disposed between the ribs, the openings extending into the housing for allowing air flow to the sound generation device.

According to yet another aspect of the disclosure there is provided a method of protecting a sound generation device from rain while allowing audible output from the sound generation device, the method including enclosing the sound generation device at least partially within a housing; and providing a grill on the housing, the grill including a plurality of ribs, the ribs angled downward in a direction across the surface of the housing, each of the ribs having a distal end portion that overlaps the surface of said housing, and one or more openings disposed between the ribs, the openings extending into the housing for allowing air flow to the sound generation device.

While the principles of the invention have been described herein, it is to be understood by those skilled in the art that this description is made only by way of example and not as a limitation as to the scope of the invention. The features and aspects described with reference to particular embodiments disclosed herein are susceptible to combination and/or application with various other embodiments described herein. Such combinations and/or applications of such described features and aspects to such other embodiments are contemplated herein. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A system comprising:
- a sound generation device for generating an audible output; and
- a housing at least partially enclosing said sound generation device and comprising a grill,
  - said grill comprising
    - a plurality of ribs extending outwardly from an adjacent front exterior surface of said housing and angled downward in a direction across said front exterior surface of said housing, each of said ribs having a flange portion, a body portion extending from said flange portion and away from said front exterior surface of said housing, an arm portion extending downwardly from said body portion, and a distal end portion that overlaps said front exterior surface of said housing; and
    - one or more openings disposed between said ribs, said openings extending into said housing for allowing air flow to said sound generation device.

2. A system according to claim 1, wherein said flange portion is part of the front exterior surface, and wherein at least one of said openings is disposed between said flange portion and a bottom surface of a next adjacent one of said ribs.

3. A system according to claim 1, wherein at least one of said body portions extends downwardly away from said front exterior surface of said housing.

4. A system according to claim 1, wherein said grill comprises a curved grill top portion that extends away from said front exterior surface of said housing, the curved grill top portion having at least one curved rib included in said plurality of ribs.

5. A system according to claim 1, wherein said grill comprises a central rib, and wherein a first number of said plurality of ribs extends from a first side of said central rib, and wherein a second number of said plurality of ribs extends from a second side of said central rib.

6. A system according to claim 5, wherein said grill comprises a curved grill top portion and intersected by said central rib, and wherein a third number of said plurality of ribs extends from a first side of said curved grill top portion, and wherein a fourth number of said plurality of ribs extends from a second side of said curved grill top portion.

7. A system according to claim 1, wherein said grill comprises a central rib, and wherein a first one of said plurality of ribs extends from a first side of said central rib and a second one of said plurality of ribs extends from a second side of said central rib, and wherein said first one and said second one of said ribs intersect said central rib to form a reverse V-shape.

8. A system according to claim 1, wherein said plurality of ribs are angled downward at an angle sufficient to cause the force of gravity on water disposed on said ribs to overcome a capillary effect on said water.

9. A system according to claim 1, wherein said plurality of ribs are angled downward at an angle between 20° and 85°.

10. A system according to claim 1, wherein said plurality of ribs are angled downward at an angle of 45°.

11. A grill for a housing that at least partially encloses a sound generation device, said grill comprising:
- a plurality of ribs, said ribs extending outwardly from an adjacent front exterior surface of said housing and angled downward in a direction across said front exterior surface of the housing, each of said ribs having a flange portion, a body portion extending from said flange portion and away from said front exterior surface of said housing, an arm portion extending downwardly from said body portion, and a distal end portion that overlaps said front exterior surface of said housing; and
- one or more openings disposed between said ribs, said openings extending into the housing for allowing air flow to said sound generation device.

12. A grill according to claim 11, wherein said flange portion is part of the front exterior surface, and wherein at least one of said openings is disposed between said flange portion and a bottom surface of a next adjacent one of said ribs.

13. A grill according to claim 11, wherein at least one of said body portions extends downwardly away from said front exterior surface of said housing.

14. A grill according to claim 11, wherein said grill comprises a curved grill top portion that extends away from said front exterior surface of said housing, the curved grill top portion having at least one curved rib included in said plurality of ribs.

15. A grill according to claim 11, wherein said grill comprises a central rib, and wherein a first number of said plurality of ribs extends from a first side of said central rib, and wherein a second number of said plurality of ribs extends from a second side of said central rib.

16. A grill according to claim 15, wherein said grill comprises a curved grill top portion intersected by said central rib, and wherein a third number of said plurality of ribs extends from a first side of said curved grill top portion, and wherein a fourth number of said plurality of ribs extends from a second side of said curved grill top portion.

17. A grill according to claim 11, wherein said grill comprises a central rib, and wherein a first one of said plurality of ribs extends from a first side of said central rib and a second one of said plurality of ribs extends from a second side of said central rib, and wherein said first one and said second one of said ribs intersect said central rib to form a reverse V-shape.

18. A grill according to claim 11, wherein said plurality of ribs are angled downward at an angle sufficient to cause the force of gravity on water disposed on said ribs to overcome any capillary effect on said water.

19. A grill according to claim 11, wherein said plurality of ribs are angled downward at an angle between 20° and 85°.

20. A grill according to claim 11, wherein said plurality of ribs are angled downward at an angle of 45°.

21. A method of protecting a sound generation device from rain while allowing audible output from the sound generation device, said method comprising:
- enclosing the sound generation device at least partially within a housing; and
- providing a grill on the housing, said grill comprising a plurality of ribs extending outwardly from an adjacent front exterior surface of said housing and angled downward in a direction across said front exterior surface of said housing, each of said ribs having a flange portion, a body portion extending from said flange portion and away from said front exterior surface of said housing, an arm portion extending downwardly from said body portion, and a distal end portion that overlaps said front exterior surface of said housing; and one or more openings disposed between said ribs, said openings extending into said housing for allowing air flow to said sound generation device.

22. A method according to claim 21, wherein said flange portion is part of the front exterior surface, and wherein at least one of said openings is disposed between said flange portion and a bottom surface of a next adjacent one of said ribs.

23. A method according to claim 21, wherein at least one of said body portions extends downwardly away from said front exterior surface of said housing.

24. A method according to claim 21, wherein said plurality of ribs are angled downward at an angle sufficient to cause the force of gravity on water disposed on said ribs to overcome any capillary effect on said water.

25. A method according to claim 21, wherein said plurality of ribs are angled downward at an angle between 20° and 85°.

* * * * *